(12) United States Patent
Spinnler et al.

(10) Patent No.: US 9,436,209 B2
(45) Date of Patent: Sep. 6, 2016

(54) METHOD AND SYSTEM FOR CLOCK RECOVERY WITH ADAPTIVE LOOP GAIN CONTROL

(75) Inventors: Bernhard Spinnler, Oberhaching (DE); Christina Hebebrand, Kiel (DE); Stefano Calabro, München (DE)

(73) Assignee: Xieon Networks S.a.r.l., Luxembourg (LU)

( * ) Notice: Subject to any disclaimer, the term of this patent is extended or adjusted under 35 U.S.C. 154(b) by 0 days.

(21) Appl. No.: 13/824,551

(22) PCT Filed: Sep. 16, 2011

(86) PCT No.: PCT/EP2011/066110
§ 371 (c)(1),
(2), (4) Date: Dec. 18, 2013

(87) PCT Pub. No.: WO2012/035142
PCT Pub. Date: Mar. 22, 2012

(65) Prior Publication Data
US 2014/0112424 A1    Apr. 24, 2014

(30) Foreign Application Priority Data
Sep. 17, 2010    (EP) .................................... 10177427

(51) Int. Cl.
| H03D 3/24 | (2006.01) |
| G06F 1/04 | (2006.01) |
| H03L 7/07 | (2006.01) |
| H03L 7/08 | (2006.01) |
| H04L 7/00 | (2006.01) |
| H03L 7/081 | (2006.01) |
| H04J 14/06 | (2006.01) |
| H04L 7/033 | (2006.01) |

(52) U.S. Cl.
CPC . *G06F 1/04* (2013.01); *H03L 7/07* (2013.01); *H03L 7/0807* (2013.01); *H04L 7/0029* (2013.01); *H03L 7/0814* (2013.01); *H04J 14/06* (2013.01); *H04L 7/0335* (2013.01)

(58) Field of Classification Search
USPC ........................................................ 375/375
See application file for complete search history.

(56) References Cited

U.S. PATENT DOCUMENTS

| 6,128,357 A | 10/2000 | Lu et al. |
| 6,909,331 B2* | 6/2005 | Ballantyne ........... H03C 3/0933 331/10 |
| 2002/0003847 A1* | 1/2002 | Yamamoto et al. .......... 375/344 |
| 2005/0047761 A1* | 3/2005 | Babb et al. .................... 388/805 |
| 2007/0092040 A1* | 4/2007 | Higashino ..................... 375/327 |
| 2007/0121773 A1* | 5/2007 | Kuan et al. .................... 375/376 |

FOREIGN PATENT DOCUMENTS

EP    0926857 A2    6/1999

\* cited by examiner

*Primary Examiner* — Tanmay Shah
(74) *Attorney, Agent, or Firm* — Nelson Mullins Riley & Scarborough LLP

(57) ABSTRACT

A method for phase recovery in a system that includes a clock recovery unit and an estimation unit. The clock recovery unit of the system has a first phase detector unit. The estimation unit has a second phase detector unit and it is configured to estimate a gain of the second phase detector unit. The estimation unit and the clock recovery unit are configured to operate in parallel.

10 Claims, 6 Drawing Sheets

METHOD AND SYSTEM FOR CLOCK RECOVERY WITH ADAPTIVE LOOP GAIN CONTROL

FIELD OF THE INVENTION

The invention relates to a method and to a device for clock recovery and to a communication system comprising such a device.

BACKGROUND OF THE INVENTION

In order to increase the bandwidth efficiency and robustness against distortions, optical communication systems require modulation formats of higher order like, e.g., 100 Gbit/s coherently demodulated polarization multiplex of quaternary phase-shift keying (CP-QPSK). Hence, both polarizations (e.g., x-polarization and y-polarization) of PolMUX and the constellations of the complex signal (QPSK) are utilized for conveying data (e.g., as symbols).

With the modulation format increasing, the symbol rate in the optical system is reduced. For example, in the case of 100 Gbit/s CP-QPSK with 4 bits per symbol, the symbol rate amounts to 100/4=25 GSymbols/s. This makes the transmission more robust against optical distortions like chromatic dispersion (CD) or polarization mode dispersion (PMD). Such reduction of the symbol rate also allows for less processing power at the receiver.

A typical arrangement of a coherent receiver used in a conventional CP-QPSK optical communication system is shown in FIG. 1. An input 101 to the coherent receiver 100 is connected to a polarization beamsplitter 102. The polarization beamsplitter 102 has first output 103, transmitting the first polarization component PolX, and a second output 104 transmitting the second polarization component PolY. The first output 103 of the polarization beamsplitter 102 is connected to a first 90° optical hybrid 105, while the second output 104 of the polarization beamsplitter 102 is connected to a second 90° optical hybrid 106. A receiver local oscillator (LO) 107 has a first output 108 connected to the first 90° optical hybrid 105 and a second output 109 connected to the second 90° optical hybrid 106. A first output port 137 of the first 90° optical hybrid 105 is connected to a first photodetector 141, while a second output port 138 of the first 90° optical hybrid 105 is connected to a second photodetector 110. A first output port 119 of the second 90° optical hybrid 106 is connected to a third photodetector 120, while a second output port 121 of the second 90° optical hybrid 106 is connected to a fourth photodetector 122. The output 111 of the first photodetector 141 is fed to a first low pass filter 113, and the outputs 112, 139 and 140 respectively of the second 110, third 120 and fourth 122 photodetectors are fed respectively to a second 114, third 123, and fourth 124 low pass filters. The output of the first low pass filter 113, namely the in-phase signal IX 115 of the first polarization component PolX 103, is connected to a first analog-to-digital converter (ADC) 117. The output of the second low pass filter 114, namely the quadrature signal QX 116 of the first polarization component PolX 103, is connected to a second analog-to-digital converter (ADC) 118. The output of the third low pass filter 123, namely the in-phase signal IY 125 of the second polarization component PolY 104, is connected to a third analog-to-digital converter (ADC) 127. The output of the fourth low pass filter 124, namely the quadrature signal QY 126 of the second polarization component PolY 104, is connected to a fourth analog-to-digital converter (ADC) 128. The four free-running analog-to-digital converters (ADC) 117, 118, 127 and 128 are all fed by the clock 129 working at the frequency $f_{ADC}$. The outputs of the four analog-to-digital converters (ADC) 117, 118, 127 are connected to a digital signal processing (DSP) unit 130 where the fully digitized signal is then processed by a fully digital clock recovery unit 131 followed by an equalization unit 132, a carrier recovery unit 133, a first 134 and a second 135 comparator circuits and a decoding unit 136.

FIG. 2 shows a conventional clock recovery arrangement implemented as a second order Phase Locked Loop (PLL) 200 with an active PI-filter 201 (i.e. a filter with perfect integrator path) and a Gardner Phase Detector (PD) 202. The in-phase signal IX 205 is supplied to the first analog-to-digital converter (ADC) 206, which is fed by the clock 207 working at the frequency $f_{ADC}$, while the quadrature-phase signal QX 208 is supplied to the second analog-to-digital converter (ADC) 206, which is fed by the clock 207 working at the frequency $f_{ADC}$. The outputs 211 and 212 of the analog-to-digital converters (ADC) 206 and 210 are connected to an interpolation unit 204. The first output $IX_{corr}(k)$ 213 and the second output $QX_{corr}(k)$ 214 of the interpolation unit 204 are each supplied to a Gardner Phase Detector (PD) 202. The output 215 of the Gardner Phase Detector (PD) 202 is supplied to an active PI-filter 201 (i.e. filter with perfect integrator path) whose output 217 is connected to a Numerically Controlled Oscillator (NCO) 203. The output ε 216 of the Numerically Controlled Oscillator (NCO) 203 is fed to the interpolation unit 204. The outputs 211 and 212 of the analog-to-digital converters (ADC) 206 and 210 include about two samples per symbol. The exact value depends on the difference between the clock frequency $f_{ADC}$ 207 and 209 of the ADCs 206 and 210 and twice the symbol frequency of the received signal (here called symbol frequency offset $\Delta f_{Sym}$). For correction of $\Delta f_{Sym}$ and the initial phase shift of the ADCs 206 and 210, the sampled signal is interpolated in the interpolation unit 204 at the time instants ε produced by the numerically controlled oscillator NCO 203 of the digital PLL. The Gardner Phase Detector (PD) 202 uses three samples for calculation of the overall timing error. A conventional Gardner Phase Detector is described by F. M. Gardner in "A BPSK/QPSK Timing-Error Detector for Sampled Receivers", *IEEE Transactions on Communications*, Vol. COM-34, No. 5, May 1986, pp. 423-429.

FIG. 3 shows the output signal of the Gardner phase error detector 300 as a function of the phase error τ 302 expressed as fraction of a period. The curve 301 possesses a horizontal sinusoidal shape and is commonly termed s-curve. Its amplitude or its maximum derivation is termed by Gardner as "phase detector gain" $K_D$ indicating the performance quality.

The dynamic behavior of a clock recovery loop as shown in FIG. 2 depends among other parameters on the loop gain which is the product of all amplification factors in the loop, e.g. the loop filter gain $K_p$, the NCO gain $K_0$ (gain of the numerically controlled oscillator NCO 203), but also the implicit gain of the phase detector $K_D$.

The problem is that the phase detector gain $K_D$ and thus the dynamic behavior of the loop depends on the input signal and especially on the distortions present in the input signal. This is undesirable since it makes the loop behavior difficult to analyze and predict.

As shown in J. W. M. Bergmans, "Digital Baseband Transmission and Recording", Kluwer, 1996 and in F. M. Gardner, "Phaselock Techniques", 2nd edition, Wiley, 1979, to characterize a second order Phase-Locked Loop PLL only the damping factor ζ and either the natural frequency $\omega_n$ or the loop bandwidth $B_L$ have to be known. From these two parameters all other parameters can be derived:

$$\omega_n T_S = \sqrt{K_f K_D K_0}, \quad (1)$$

$$\zeta = \frac{1}{2}\sqrt{K_D K_0 \frac{K_p^2}{K_f}},$$

$$B_L T_S = \omega_n T_S \left(\zeta + \frac{1}{4\zeta}\right)$$

where the loop filter gain $K_p$ is the amplification factor of the PI-filter in the proportional part and $K_f$ is the amplification factor of the PI-filter in integral part (see FIG. 2), $K_0$ is the oscillator slope, $K_D$ is the phase detector slope and $T_S$ is the symbol duration. The amplifications $K_p$, $K_f$ and $K_0$ are fixed parameter, which will not change during transmission, whereas the parameter $K_D$ depends mainly on the pulse shape and the power of the received signal, but also on the distortions on the channel due to Differential Group Delay (DGD) and chromatic dispersion (CD). Due to these distortions, $K_D$ may vary depending on the transmission conditions. Therefore, it has to be distinguished between $K_{D,\ design}$, which is used to design the PLL and $K_{D,\ signal}$ which results at the Phase Detector (PD) output after transmission. Simulations have shown that due to varying Differential Group Delay (DGD) on the channel the $K_{D,\ signal}$ at the Phase Detector (PD), output changes and this changes the loop gain of the whole PLL. The impact of changing $K_{D,\ signal}$ on the parameter of the PLL can be seen in Equation (2). It gives the effective parameters for the case that $K_{D,\ design}=xK_{D,\ signal}$. For $K_{D,\ signal}<K_{D,\ design}$ the effective loop bandwidth $B_{L,\ eff}$ decreases due to the decreasing loop gain and vice versa.

$$\zeta_{eff} = \frac{1}{\sqrt{x}}\zeta_{design}, \quad (2)$$

$$\omega_{n,eff} = \frac{1}{\sqrt{x}}\omega_{n,design},$$

$$B_{L,eff} = z B_{L,design}$$

with $$z = \left(1 + \frac{\zeta_{design}}{\zeta_{design} + \frac{1}{4\zeta_{design}}}\left(\frac{1}{x} - 1\right)\right)$$

This behavior is a critical point in the design of the clock recovery. The clock recovery has to be stable during the whole transmission even if the loop gain changes. In general there are several limitations for the loop bandwidth $B_{L,\ eff}$. The first one is the maximum symbol frequency offset which can be tracked. This limitation can be overcome by use of an active PI-filter which guarantees, in theory, that arbitrarily large symbol frequency offsets $\Delta f_{Sym}$ can be tracked. Thus, in terms of symbol frequency offset only the pull-in time is a criterion and the lower limit of the loop bandwidth is determined by the desired jitter tolerance. A further limitation is the additional delay in the loop.

As shown in J. W. M. Bergmans, "Effect of Loop Delay on Stability of Discrete-Time PLL", IEEE Trans. Circuits and Syst. I, Vol. 42, No. 4, pp. 229-231, April 1995, the maximum loop bandwidth for a given additional loop delay of M symbols can be calculated as follows:

$$B_{L,design}T < 1/(2M_{design} + 1)\left(\zeta_{design} + \frac{1}{4\zeta_{design}}\right) \quad (3)$$

If the effective loop bandwidth $B_{L,\ eff}$ increases, e.g. due to varying Differential Group Delay (DGD), the PLL may become unstable. The effective maximum tolerable additional loop delay of $M_{eff}$ symbols for $K_{D,\ design}=xK_{D,\ signal}$ is:

$$2M_{eff}+1=(2M_{design}+1)\sqrt{x} \quad (4)$$

Conventional clock recovery designs as, for example, described in FIG. 2, usually assume a fully equalized and properly amplified input signal. Deviations of the input signal from these ideal conditions lead to a different than designed dynamic loop behaviour. The "solution" usually is to design the loop for the most probable scenario and restrict the input signal distortions to a limited range. If the distortions exceed this range, however, the loop may take longer than specified to reach the steady state and it may even become unstable and fail completely.

The problem to be solved is to overcome the disadvantages stated above and in particular to provide a solution that allows a stable loop behavior which can be adaptively adjustable.

SUMMARY OF THE INVENTION

This problem is solved according to the features of the independent claims. Further embodiments result from the depending claims.

In order to overcome this problem, a system comprising:
a clock recovery unit comprising a first phase detector unit; an estimation unit comprising a second phase detector unit, the estimation unit being configured to estimate the gain ($K_D$) of the second phase detector unit; wherein the estimation unit and the clock recovery unit are configured to operate in parallel.

In another embodiment, the estimated gain ($K_D$) of the second phase detector unit is configured to feed the first phase detector unit (402).

In a further embodiment, the system is configurable to achieve a constant loop gain In a next embodiment the constant loop gain is configured to be adaptively adjustable.

In a further embodiment, the estimated gain ($K_D$) of the second phase detector unit comprises a variable part ($K_{D,\ signal}$).

In another embodiment, the system is adjustable in such a way that the variable part ($K_{D,\ signal}$) of the estimated gain ($K_D$) can be reduced to zero.

In a next embodiment, the clock recovery unit comprises a phase-locked-loop (PLL) system.

In a further embodiment, the phase-locked-loop (PLL) system includes a filter with perfect integrator (PI) path.

In a next embodiment, the first phase detector unit and the second phase detector unit are Gardner phase detectors.

In another embodiment, the system is a communication system.

In a next embodiment, the communication system is an optical communication system.

The problem stated above is further solved by a method of phase recovery for a system, the system comprising a clock recovery unit and an estimation unit, the clock recovery unit comprising a first phase detector unit and the estimation unit comprising second phase detector unit, the method comprising: estimating the gain of the second phase detector unit; wherein the estimation unit and the clock recovery unit operate in parallel.

In another embodiment, the method further comprises that the estimated gain ($K_D$) of the second phase detector unit feeds the first phase detector unit.

In a next embodiment, the method further comprises the step of adjusting the system so that a constant loop gain can be achieved.

In a further embodiment, the method further comprises that the constant loop gain is adaptively adjustable.

Particular properties and/or advantages of the approach provided may in particular be as follows:
  a. The influence of $K_{D,\,signal}$ on the dynamics of the PLL can be cancelled out.
  b. The loop behavior is stable and can be adaptively adjustable.

BRIEF DESCRIPTION OF THE DRAWINGS

The invention is explained by way of example in more detail below with the aid of the attached drawings.

DESCRIPTION OF THE INVENTION

Figure 1:
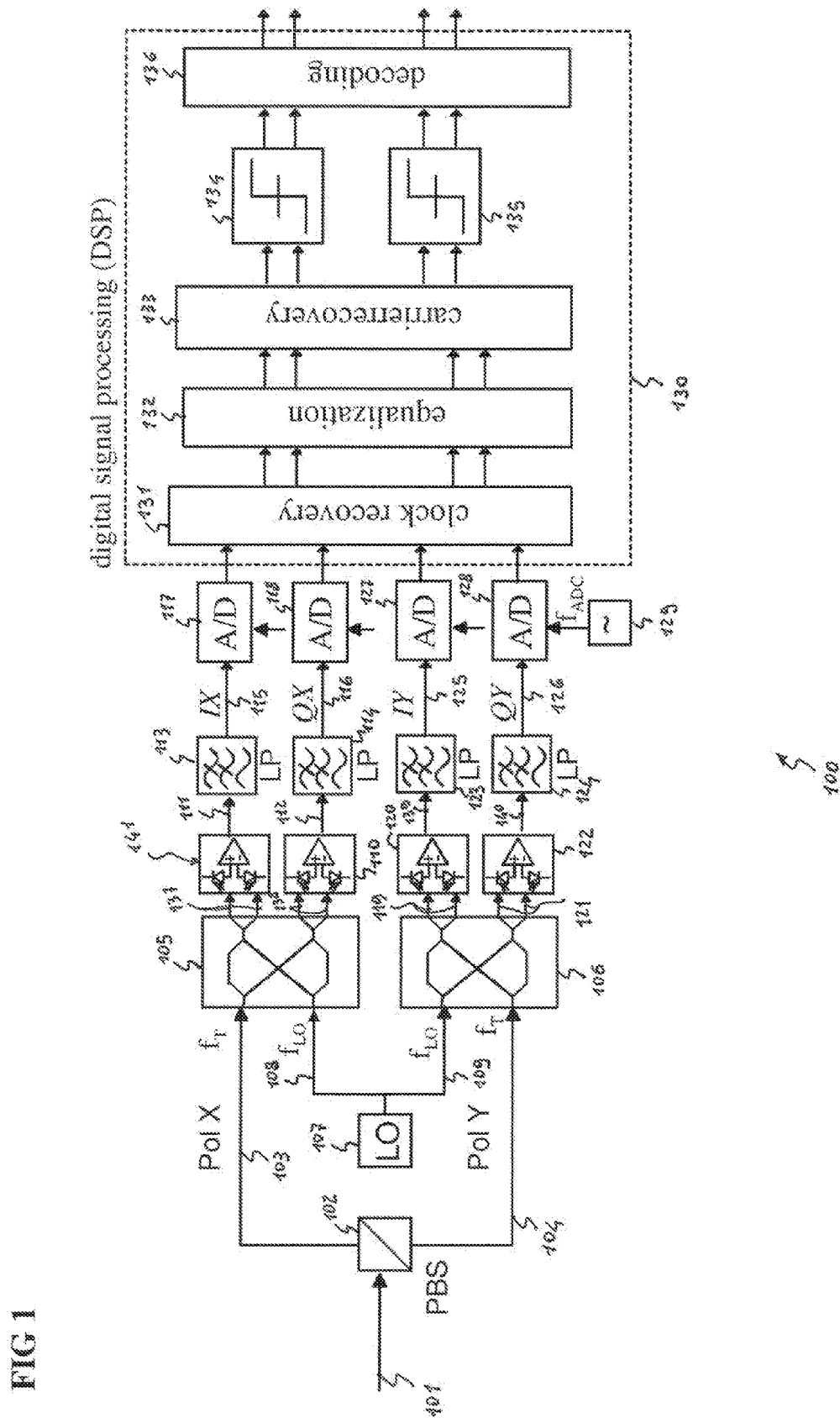
FIG. 1 is a representation of a coherent receiver used in a conventional CP-QPSK optical communication system.
Figure 2:
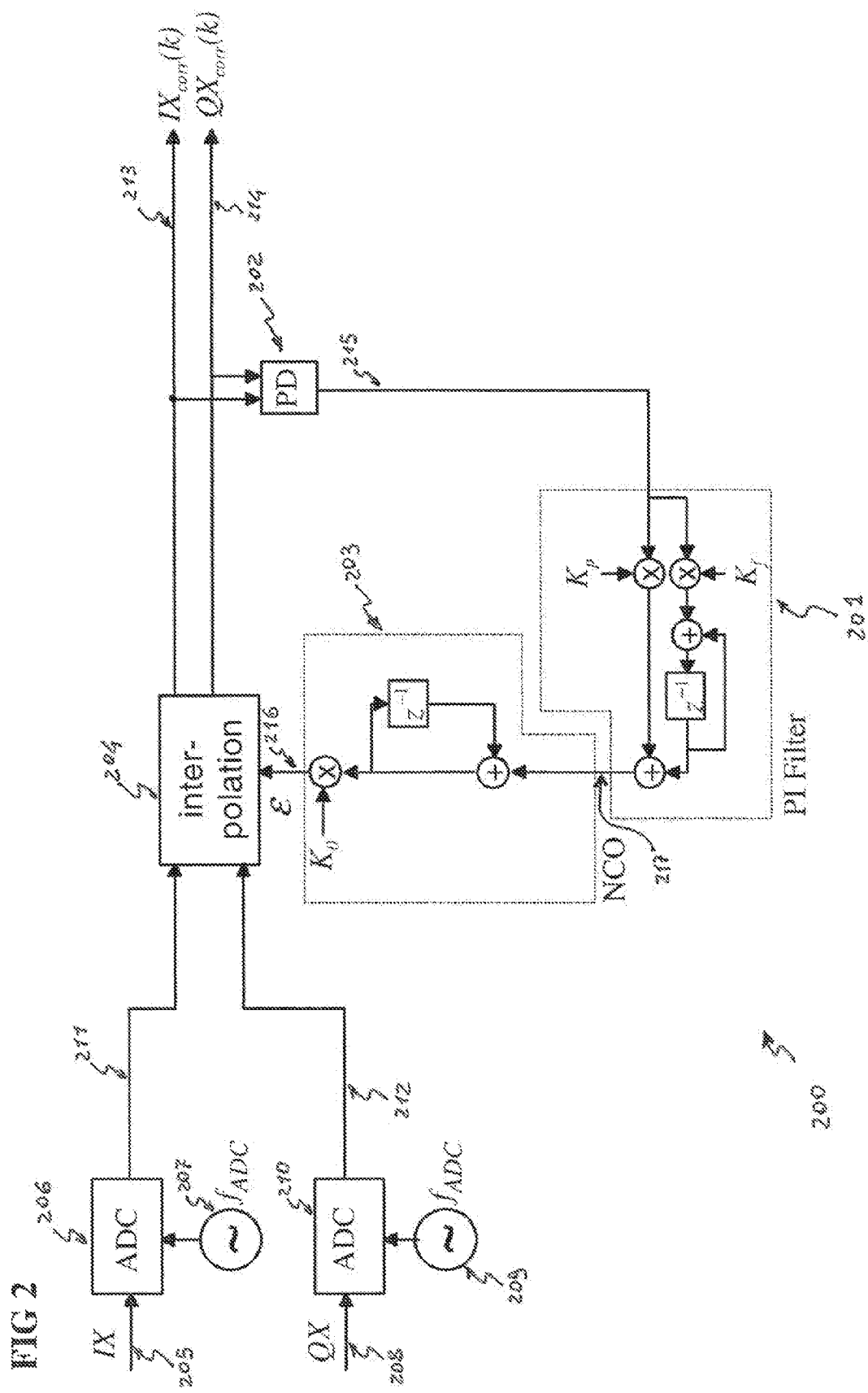
FIG. 2 shows a conventional clock recovery arrangement
Figure 3:
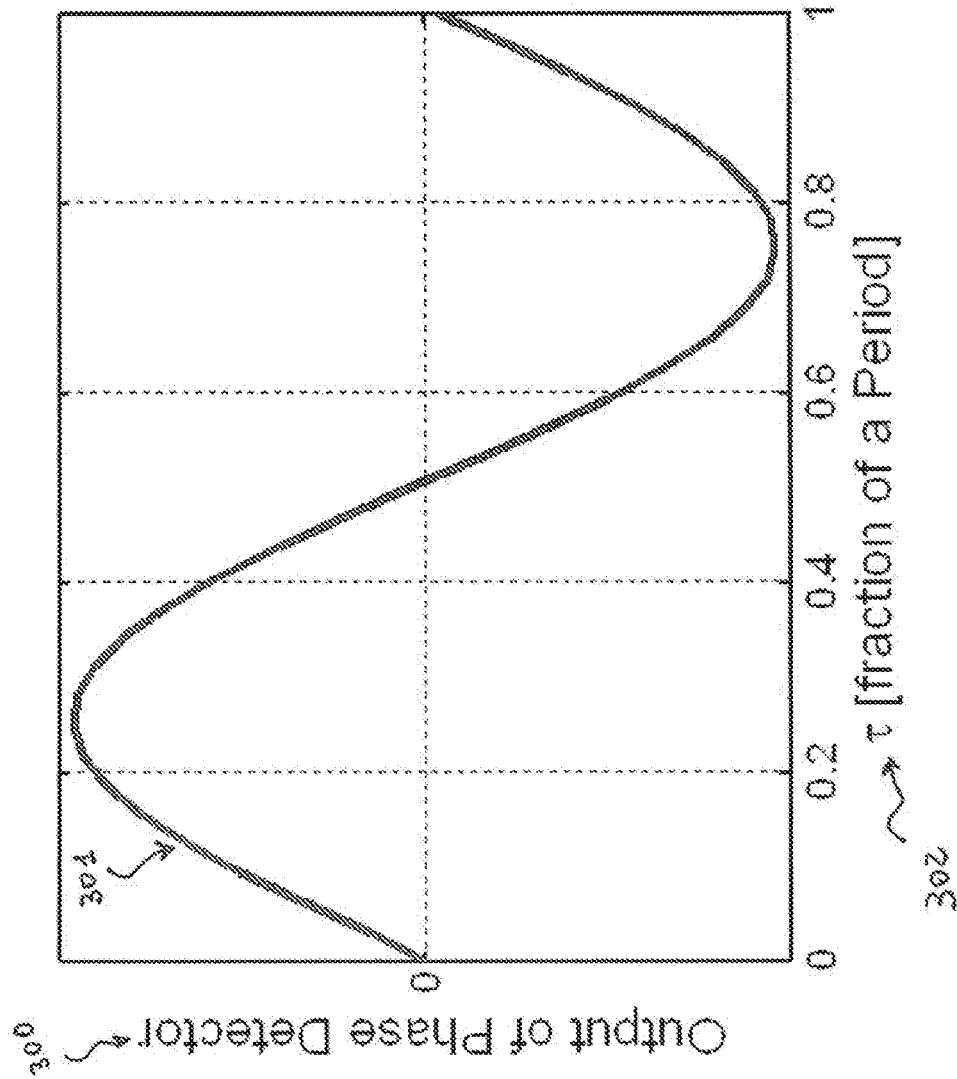
FIG. 3 shows the output signal of the Gardner phase error detector as a function of the phase error τ expressed as fraction of a period.

As regards the description of FIGS. 1 to 3, reference is made to the background of the invention.

Illustrative embodiments will now be described with reference to the accompanying drawings to disclose the teachings of the present invention. While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 4:
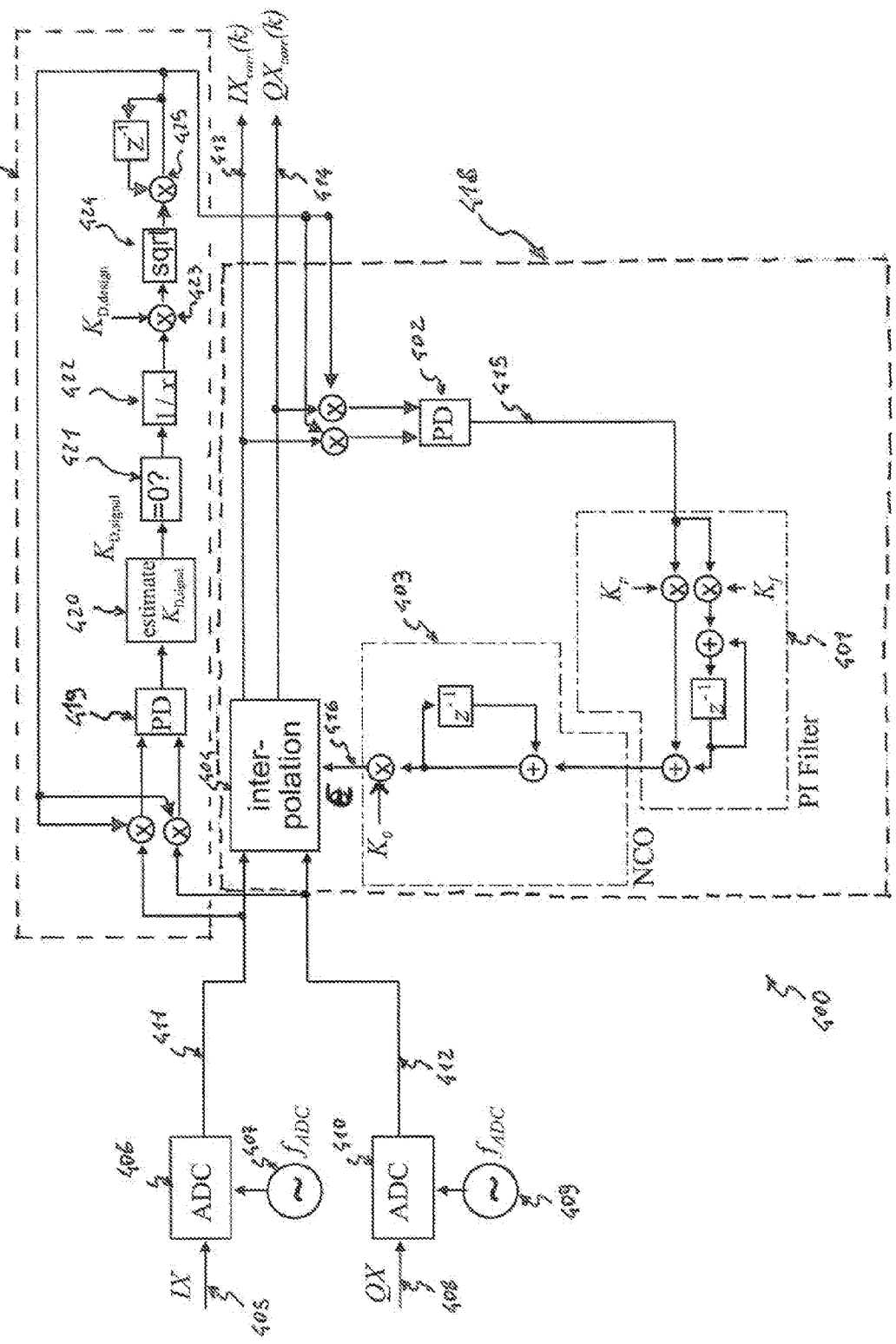
FIG. 4 shows a clock recovery arrangement according to an embodiment of the invention.

FIG. 4 shows a clock recovery arrangement according to an embodiment of the invention, including a clock recovery unit (418) and an estimation unit (417), the clock recovery unit (418) including a first phase detector unit (402), and the estimation unit (417) including a second phase detector unit (419). The in-phase signal IX 405 is supplied to the first analog-to-digital converter (ADC) 406, which is fed by the clock 407 working at the frequency $f_{ADC}$ while the quadrature-phase signal QX 408 is supplied to the second analog-to-digital converter (ADC) 406, which is fed by the clock 407 working at the frequency $f_{ADC}$. The outputs 411 and 412 of the analog-to-digital converters (ADC) 406 and 410 are connected to an interpolation unit 404. The first output $IX_{corr}(k)$ 413 and the second output $QX_{corr}(k)$ 414 of the interpolation unit 404 are each supplied to a first Gardner Phase Detector (PD) 402. The output 415 of the first Gardner Phase Detector (PD) 402 is supplied to an active PI-filter 401 (i.e. filter with perfect integrator path) whose output 417 is connected to a Numerically Controlled Oscillator (NCO) 403. The output ε 416 of the Numerically Controlled Oscillator (NCO) 403 is fed to the interpolation unit 404.

The way in which the invention obtains a defined and stable loop behaviour is to estimate the phase detector gain in parallel to the clock recovery loop 418. Once this estimate has been obtained, it can be used to adjust a variable gain inside the loop in order to cancel out the variable part of the loop gain and achieve a constant overall loop gain which can be designed to be any favourable value.

In particular, before the clock recovery, an open loop configuration 417 is implemented which includes the same Phase Detector (PD) unit 419 as the one 402 included in the closed loop 418. The interpolator 404 can be omitted for this structure if a symbol frequency offset is considered, which may be the case in realistic setups. In this open loop configuration 417 first the s-curve is estimated by the Phase Detector (PD) unit 419 and from this estimation $K_{D,\,signal}$ is calculated by the $K_{D,\,signal}$ estimation unit 420. Moreover, the comparing unit 421 tests if the calculated $K_{D,\,signal}$ is zero. For the case that $K_{D,\,signal}$ is zero, this parameter is set to a fixed value. The inverse of the calculated $K_{D,\,signal}$ is calculated by the inverting unit 422, and this value is multiplied with $K_{D,\,design}$ by the multiplying unit 423. For multiplication before the phase detector the square root is taken from this product by the square root unit 424. Afterwards this value is multiplied with the last estimated value by the multiplying unit 425 and then fed as an additional amplification or attenuation factor into the loop 418 and also into the open loop 417 as input to the first phase detector unit (402) and to the second phase detector unit (419). Due to this adaptive control the influence of $K_{D,\,signal}$ on the dynamics of the PLL is cancelled out. The speed of this adaptive control depends on the symbol frequency offset of the ADC. This offset determines the time, how long it takes to get a full s-curve, which is necessary to determine the actual $K_{D,\,signal}$.

The approach described in the present invention can be used in any kind of loop where the loop behaviour depends on the distortions present in the input signal. In particular this applies to all control loops.

Figure 5:
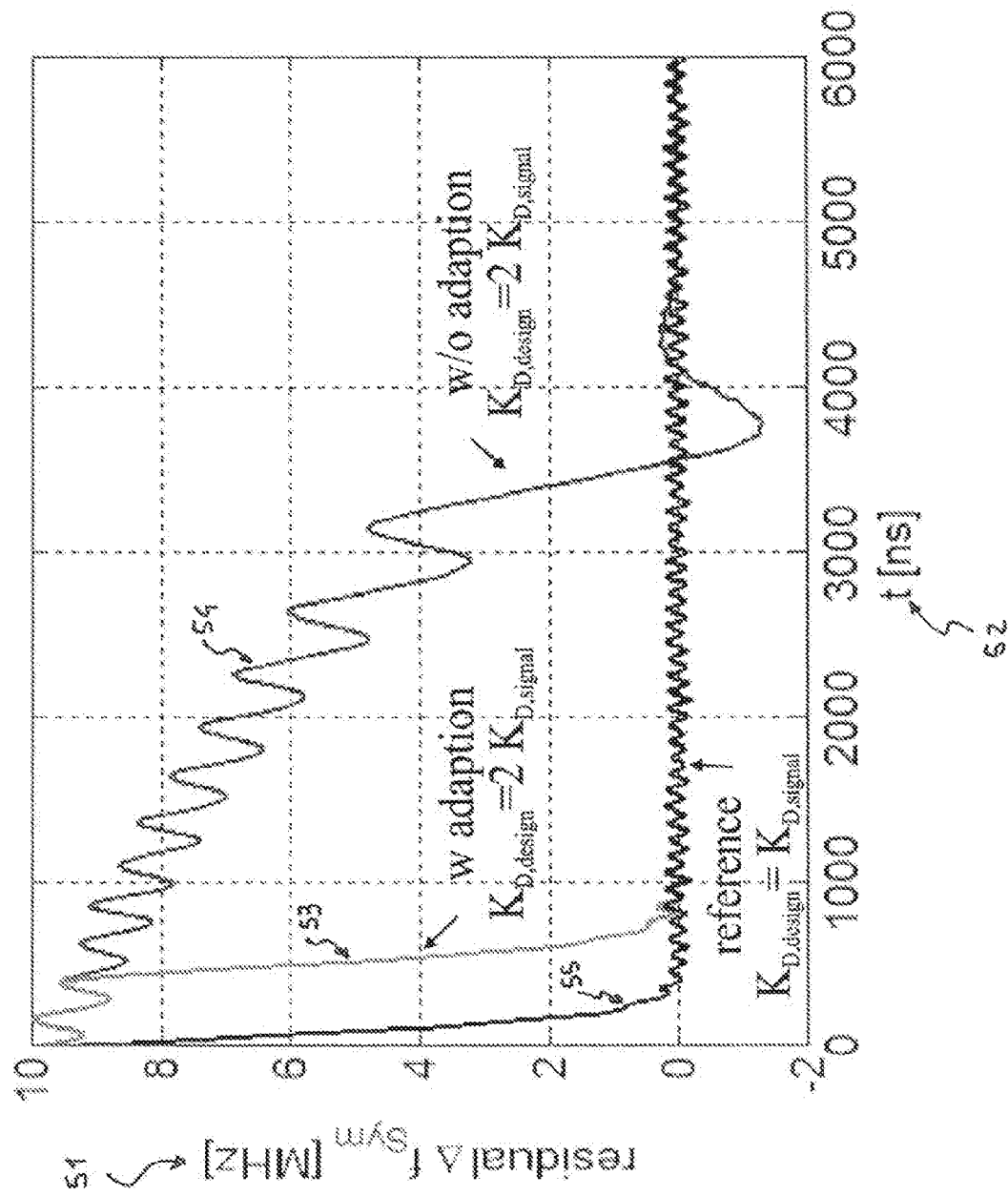
FIG. 5 is an exemplary representation of the residual symbol frequency offset $\Delta f_{Sym}$ as a function of the time.

FIG. 5 is an exemplary representation of the residual symbol frequency offset $\Delta f_{Sym}$ 51 as a function of the time 52 expressed in nanoseconds. The residual symbol frequency offset $\Delta f_{Sym}$ 51 is derived from the output of the integral part of the PI-filter 401, during the lock-in procedure for a 112 Gbit/s CP-QPSK transmission with an OSNR of 15 dB. For the curve 53 (with adaption) and the curve 54 (without adaption) it was assumed that $K_{D,\,design}=2K_{D,\,signal}$ and for the curve 55 (reference) $K_{D,\,design}=K_{D,\,signal}$. The symbol frequency offset was set to $\Delta f_{Sym}=10$ MHz, the damping factor was ζ=0.707 and the loop bandwidth $B_{L,\,design}=10$ MHz. The curve 53 with adaptive control exhibits the same behavior after the time needed to calculate (for this $\Delta f_{Sym}$ about 11200 samples ~200 ns) as the reference system 55, whereas the system without adaptive control 54 requires a much longer pull-in and lock-in time, which implies a smaller loop bandwidth.

Figure 6:
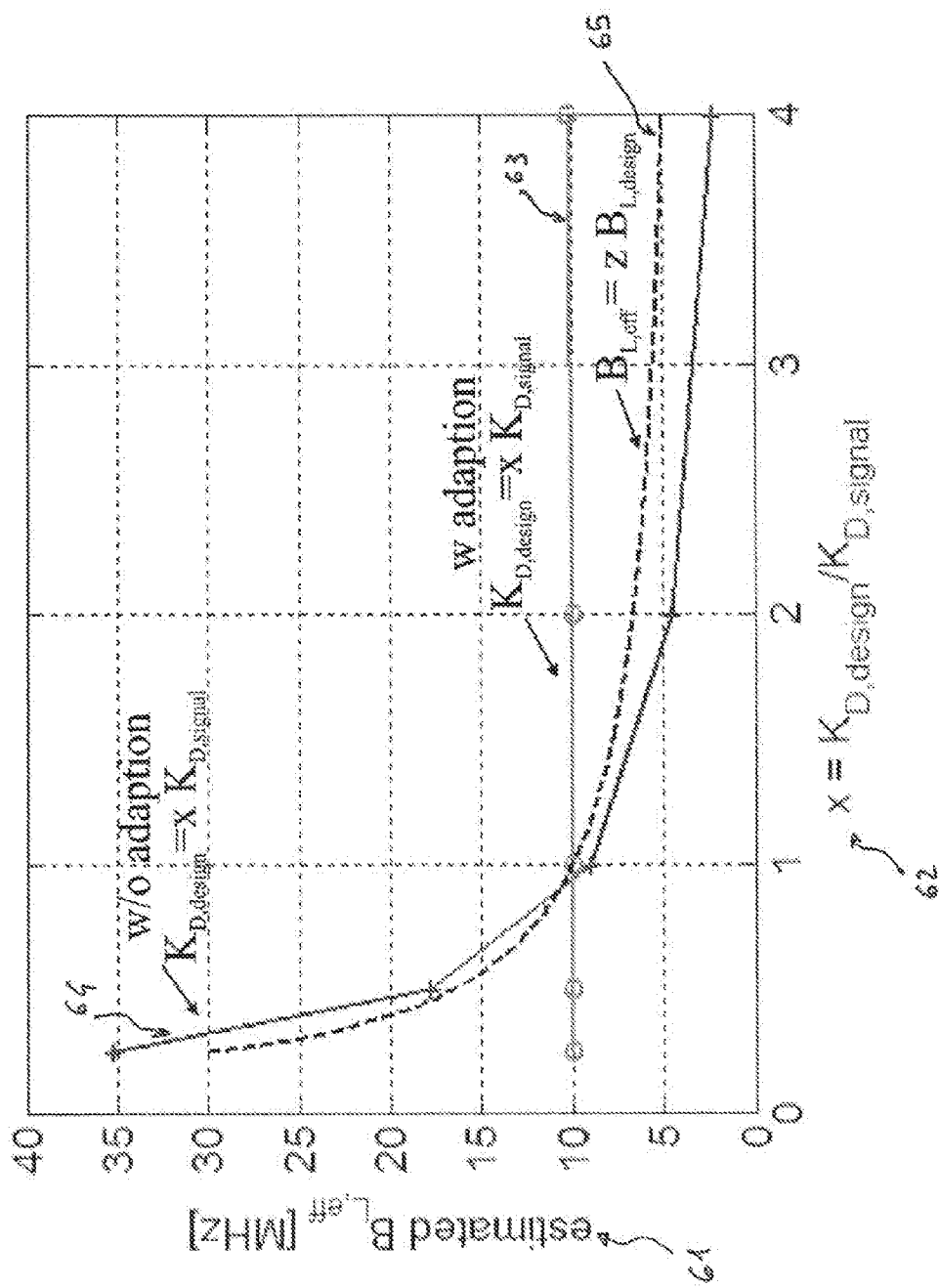
FIG. 6 is an exemplary representation of the estimated loop bandwidth $B_{L,\,eff}$.

FIG. 6 is an exemplary representation of the estimated loop bandwidth $B_{L,\,eff}$ 61 after the PI-filter 401 after lock-in of the PLL for the system without 64 and with 63 adaptive control expressed as a function of the factor $x=K_{D,\,design}/K_{D,\,signal}$. FIG. 6 shows that the estimated loop bandwidth of the system without adaptive control 64 has almost the same behaviour as the analytical curve 65 for the effective loop bandwidth $B_{L,\,eff}=zB_{L,\,design}$ (equation (2)). On the contrary the estimated loop bandwidth for the system with adaptive control 63 is the same for all values of x, which implies a constant loop gain and according to this a design of the digital PLL which is independent of $K_{D,\ signal}$.

Abbreviations:
- ADC Analogue-to-Digital Converter
- BER Bit Error Rate
- CD Chromatic Dispersion
- CP-QPSK Coherent Polarization Multiplexed Quaternary Phase-Shift Keying
- DGD Differential Group Delay
- DSP Digital Signal Processing
- PD Phase Detector
- QPSK Phase-locked loop
- PLL Cross Phase Modulation

The invention claimed is:

1. A system, comprising:
   a clock recovery unit having a gain adjustment unit, a first phase detector unit, a filter and a numerically controlled oscillator coupled in a closed loop, wherein an output of the first phase detector unit is coupled to the filter, an output of the filter is coupled to the numerically controlled oscillator, and wherein a signal provided by the output of the filter controls the numerically controlled oscillator based on a signal provided by the output of the first phase detector unit;
   an estimation unit having a second phase detector unit and a gain estimation unit coupled in series, said gain estimation unit being configured to estimate a gain of said second phase detector unit;
   wherein the estimated gain of said second phase detector unit includes a variable part; and
   wherein said estimation unit and said clock recovery unit are configured to operate in parallel,
   wherein the clock recovery unit is coupled to an output of the estimation unit, and the gain adjustment unit of the clock recovery unit is adapted to adaptively adjust loop gain of the closed control loop including the first phase detector unit based on the estimated gain of the second phase detector unit to achieve a constant loop gain.

2. The system according to claim 1, wherein the estimated gain of said second phase detector unit is configured to feed said first phase detector unit.

3. The system according to claim 1, wherein the system is adjustable such that the variable part of the estimated gain can be reduced to zero substantially canceled out.

4. The system according to claim 1, wherein said clock recovery unit comprises a phase-locked-loop system.

5. The system according to claim 4, wherein said phase-locked-loop system includes said filter, and the filter has perfect integrator path.

6. The system according to claim 1, wherein said first phase detector unit and said second phase detector unit are Gardner phase detectors.

7. The system according to claim 1, wherein the system is a communication system.

8. The system according to claim 7, wherein the communication system is an optical communication system.

9. A method for phase recovery for a system, the system having a clock recovery unit and an estimation unit wherein the clock recovery unit is coupled to an output of the estimation unit, the clock recovery unit including a gain adjustment unit, a first phase detector unit a filter and a numerically controlled oscillator coupled in a closed loop, and the estimation unit including second phase detector unit and a gain estimation unit coupled in series, the method comprising:
   receiving at the filter of the clock recovery unit a signal provided by an output of the first phase detector unit, controlling the numerically controlled oscillator of the clock recovery unit by a signal provided by an output of the filter and based on the signal provided by the output of the first phase detector unit;
   estimating a gain of the second phase detector unit by the gain estimation unit, wherein the estimated gain of the second phase detector unit includes a variable part; and
   adaptively adjusting loop gain of the closed control loop including the first phase detector unit by the gain adjustment unit and based on the estimated gain of the second phase detector unit to achieve a constant loop gain.

10. The method according to claim 9, wherein the estimated gain of the second phase detector unit feeds the first phase detector unit.

* * * * *